United States Patent [19]
Wicker et al.

[11] Patent Number: 6,028,286
[45] Date of Patent: Feb. 22, 2000

[54] METHOD FOR IGNITING A PLASMA INSIDE A PLASMA PROCESSING REACTOR

[75] Inventors: Thomas E. Wicker, Reno, Nev.; Joel M. Cook, Pleasanton; Jian J. Chen, Fremont, both of Calif.

[73] Assignee: Lam Research Corporation, Fremont, Calif.

[21] Appl. No.: 09/223,692

[22] Filed: Dec. 30, 1998

[51] Int. Cl.$^7$ .................................................. B23K 10/00
[52] U.S. Cl. .............................. 219/121.53; 219/121.57; 219/123; 219/121.43; 219/121.41; 156/345; 118/723 I; 204/298.37
[58] Field of Search ........................ 219/121.43, 121.41, 219/121.59, 121.52, 123, 121.4, 121.57; 204/298.21, 298.38; 156/345; 118/723 I

[56] References Cited

U.S. PATENT DOCUMENTS

| | | |
|---|---|---|
| 4,500,408 | 2/1985 | Boys et al. ........................ 204/298.37 |
| 4,543,465 | 9/1985 | Sakudo et al. ..................... 219/121.43 |
| 4,897,285 | 1/1990 | Wilhelm ..................................... 427/39 |
| 5,053,244 | 10/1991 | Kieser et al. ............................ 427/162 |
| 5,512,150 | 4/1996 | Bourez et al. ........................ 204/192.2 |
| 5,531,834 | 7/1996 | Ishizuka et al. ...................... 118/723 I |
| 5,639,519 | 6/1997 | Patrick et al. ........................ 156/643.1 |
| 5,849,136 | 12/1998 | Mintz et al. ............................. 156/345 |
| 5,902,563 | 5/1999 | Pinneo .................................... 423/446 |

*Primary Examiner*—Mark Paschall
*Attorney, Agent, or Firm*—Beyer & Weaver, LLP

[57] ABSTRACT

The invention relates to a plasma processing reactor for processing a substrate. The plasma processing reactor includes a process chamber. The plasma processing reactor further includes an inductive coil configured to be coupled to a RF power source having a RF frequency wherein the inductive coil generates an electric field inside of the process chamber. The plasma processing reactor additionally includes a magnetic field producing device configured to produce a magnetic field inside the process chamber in proximity of the electric field.

30 Claims, 5 Drawing Sheets

METHOD FOR IGNITING A PLASMA INSIDE A PLASMA PROCESSING REACTOR

BACKGROUND OF THE INVENTION

The present invention relates to the fabrication of semiconductor integrated circuits (IC's). More particularly, the present invention relates to improved methods and apparatuses for igniting a plasma inside a plasma processing reactor.

During the manufacture of a semiconductor-based product, for example, a flat panel display or an integrated circuit, multiple deposition and/or etching steps may be employed. During the deposition step, materials are deposited onto a substrate surface (such as the surface of a glass panel or a wafer). Conversely, etching may be employed to selectively remove materials from predefined areas on the substrate surface.

There are many methods available to etch a substrate surface; one such method is plasma etching. In plasma etching, a plasma is formed from the ionization and dissociation of process gases. The positively charged ions are then accelerated towards the substrate where they drive the etching reactions.

One particular method of plasma etching uses an inductive source to generate the plasma. In order to create a plasma, a process gas is input into a plasma reactor chamber. Power is then supplied to an inductive coil using a RF power source, and a large electric field is produced inside the chamber. The electric field accelerates the small number of electrons present inside the chamber causing them to collide with the gas molecules. These collisions result in ionization and initiation of a discharge or plasma. The neutral gas molecules of the process gas when subjected to these strong electric fields lose electrons, leaving behind positively charged ions. These electrons are accelerated by the electric field produced by the induction coil and collide with other neutral molecules, causing more electrons to be ejected. This produces plasma breakdown and the plasma ignites.

To facilitate discussion, FIG. 1 a illustrates a prior art inductive plasma processing reactor 100. A typical inductive plasma processing reactor includes a chamber 102 with an antenna or inductive coil 110 disposed above a dielectric window 112. A substrate 114 is disposed above a chuck 116. The chuck 116 is disposed at the bottom of the chamber 102. When RF power is supplied to the inductive coil 110 an oscillating magnetic field 118 is created. This oscillating magnetic field 118 induces an electric current 120 with a plasma inside the chamber 102 and below the dielectric window 112. The electric current 120 flows in the opposite direction of the current in the inductive coil. The direction of the current is portrayed by the x and dot inside the inductive coil 110 and the electric current 120.

Typically, when RF power is supplied to the inductive coil 10 a voltage drop occurs across the dielectric window 112 and the vacuum chamber volume to electrically grounded surfaces. This voltage initiates the plasma breakdown. Generally, the free electrons are accelerated to a high energy by the circulating electric current 120. The electrons are accelerated in alternating directions (dependent on RF of the power source). The accelerated electrons collide with other neutral molecules creating more electrons and positively charged ions. As soon as the creation rate of free electrons exceeds their loss rate, the plasma ignites.

As can be appreciated by one skilled in the art, there are many different types of configurations for an inductive plasma processing reactor and conceptually they operate in a similar manner. By way of example, FIG. 1b is another illustration of an inductive plasma processing reactor wherein the coils are disposed around the chamber walls. An inductive plasma processing reactor 200 consists of a chamber 202 with an antenna or inductive coil 210 disposed around the chamber 202. A substrate 214 is disposed above a chuck 216. The chuck 216 is disposed above the bottom of the chamber 202. As discussed above in the description of FIG. 1a, when RF power is supplied to the inductive coil 210 an oscillating magnetic field 218 is created. This oscillating magnetic field 218 induces an electric current 220 within the plasma inside the chamber 202. The electric current 220 flows in the opposite direction of the current in the inductive coil. The direction of the current is portrayed by the x and dot inside the inductive coil 210 and the electric current 220.

Typically, the plasma is difficult to light, if the pressure is low inside the chamber. During this situation, the electrons inside the plasma have long mean free paths and may not collide with enough molecules before the electrons are lost to the chamber wall. This makes igniting the plasma very difficult. Shortening the mean free path of the electrons increases the number of collisions, which produces the chain reaction that sustains the plasma. The mean free path of the electrons can be shortened by increasing the pressure inside the chamber.

Changing the pressure has its drawbacks. By way of example, the optimal conditions for etching may be at low pressures. Therefore, if the pressure is increased to ignite the plasma, the best conditions for etching are not met. A two step process can be implemented to solve this problem by lowering the pressure after the plasma ignites under high pressure. In theory this would seem to work, except that it takes a finite amount of time to change from high to low pressure. During this time, the plasma environment changes while the substrate is present, which may produce undesirable and/or unpredictable etch results.

Also, the plasma is difficult to light if the voltage on the inductive coil is too low. In this situation, the electrons are not accelerated to a sufficiently high energy for ionization to occur. Increasing the voltage increases the energy of the electrons which results in more ionization inside the chamber.

Increasing the RF power to increase the voltages in the inductive coil has its limits. Increasing the RF power can damage or put undue wear on the electrical and mechanical components in the matching network, as well as placing additional electrical stress on other components of the RF power supply system. Also, at times it is not possible to get a high enough voltage to ignite the plasma, if the pressure is kept at the low pressure range that is called for by the etch process. Implementing a two-step process to use a high power level to light the plasma and decrease it to etch also has the aforementioned problem, i.e., the plasma environment is changed while the substrate is present. As mentioned, this change in condition may produce undesirable and/or unpredictable results.

In view of the foregoing, there are desired improved methods and apparatuses for igniting a plasma inside a plasma processing reactor without altering the preferred operating conditions, such as pressure and power.

SUMMARY OF THE INVENTION

The invention relates, in one embodiment, to a plasma processing reactor for processing a substrate. The plasma processing reactor includes a process chamber. The plasma processing reactor further includes an inductive coil configured to be coupled to a RF power source having a RF frequency wherein the inductive coil generates an electric field inside of the process chamber. The plasma processing reactor additionally includes a magnetic field producing apparatus configured to produce a magnetic field inside the process chamber in proximity of the electric field.

The invention relates, in another embodiment, to a plasma processing reactor for processing substrates inside a process chamber. The plasma processing reactor includes a means for generating an electric field inside the process chamber of the plasma processing reactor. The plasma processing reactor further includes a means, disposed externally of the process chamber, for generating a magnetic field in proximity of the electric field inside the process chamber. The plasma processing reactor additionally includes an activation means, coupled to the means for generating the magnetic field, for controlling an activation of the magnetic field.

The invention relates, in yet another embodiment, to a method of igniting a plasma inside a process chamber in a plasma processing reactor. The method includes providing an inductive coil. The method further includes coupling an RF power source to the inductive coil to provide RF power to the inductive coil, thereby generating an electric field inside the process chamber. The method additionally includes providing a magnetic field producing plasma processing reactor disposed outside of the process chamber, the magnetic field producing plasma processing reactor being configured to produced a magnetic field inside the process chamber in proximity of the electric field. The method also includes generating the magnetic field with the magnetic field producing plasma processing reactor to promote ignition of a plasma within the process chamber.

These and other advantages of the present invention will become apparent upon reading the following detailed descriptions and studying the various figures of the drawings.

DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, improved ignition of a plasma inside an inductive plasma processing reactor at low pressures is achieved by introducing a magnetic field inside the process chamber. Typically, ignition of a plasma is difficult at low pressures. As discussed earlier, at low pressures electrons have long mean free paths and are less likely to collide with molecules. The electrons that do not collide with molecules typically hit the chamber wall and recombine, making it hard to ignite the plasma. By introducing a magnetic field inside the process chamber, electrons are temporarily captured by the Lorenz force and spiral around the field lines of the magnetic field. The spiraling electrons increase their residence time inside the chamber, thereby increasing the chances of collisions with neutral gas molecules to start the chain reaction that ignites the plasma.

In another embodiment, the magnetic field is only used for aiding in plasma ignition. In order to maintain the stability of the plasma, the magnetic field is preferably turned off as soon as the plasma ignites to prevent adverse effects on the etch process.

According to another embodiment, the magnetic field is preferably placed in the proximity of the electric field produced by the inductive coils. Most of the dissociated electrons inside the process chamber are located in the electric field region. Therefore, more electrons can be influenced by the strategic placement of the magnetic field in this region.

Figure 1A:
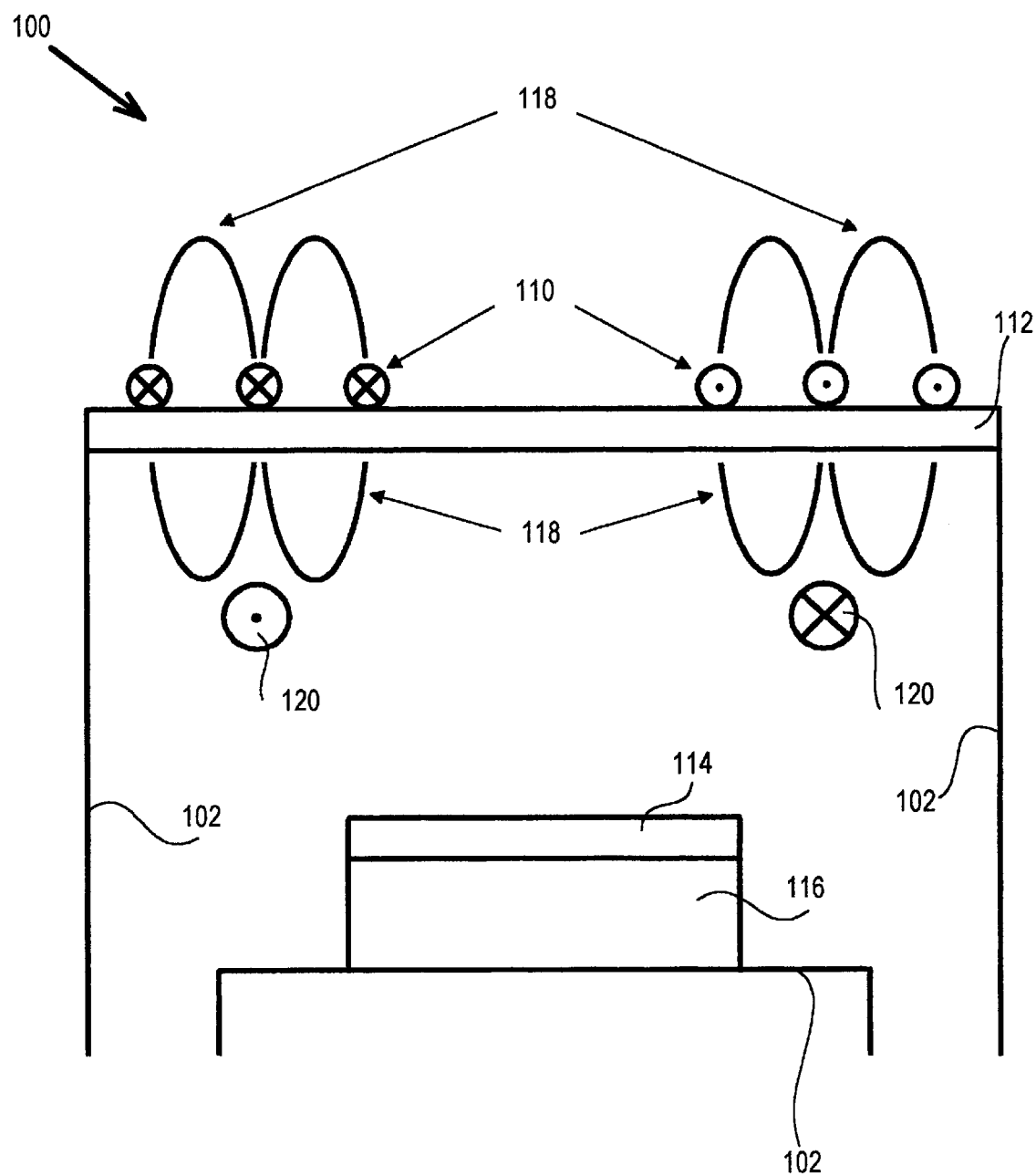
FIG. 1a is a schematic diagram of a prior art inductive plasma processing reactor.
Figure 1B:
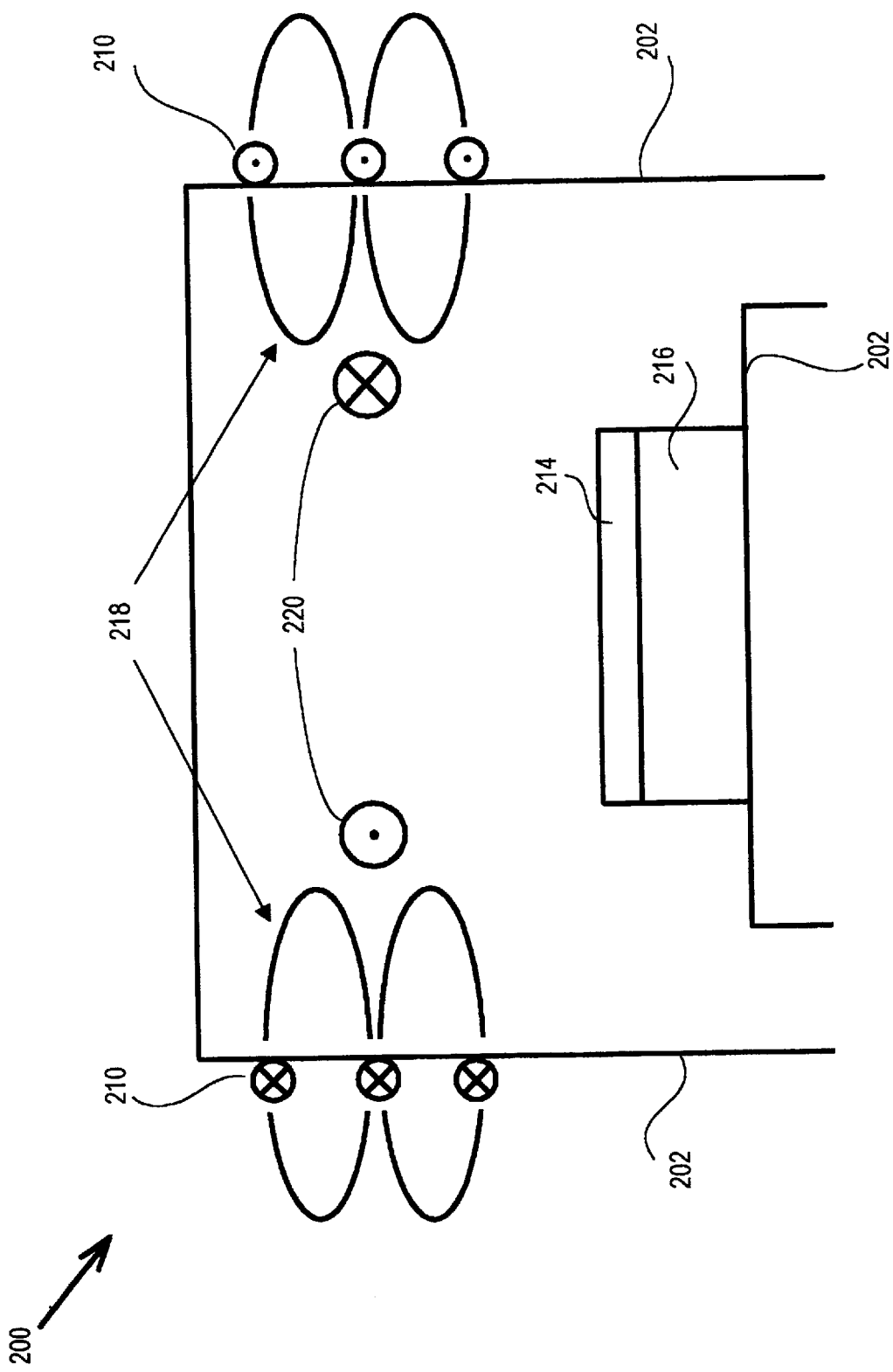
FIG. 1b is a schematic diagram of a prior art inductive plasma processing reactor with an alternative inductive configuration.
Figure 2A:
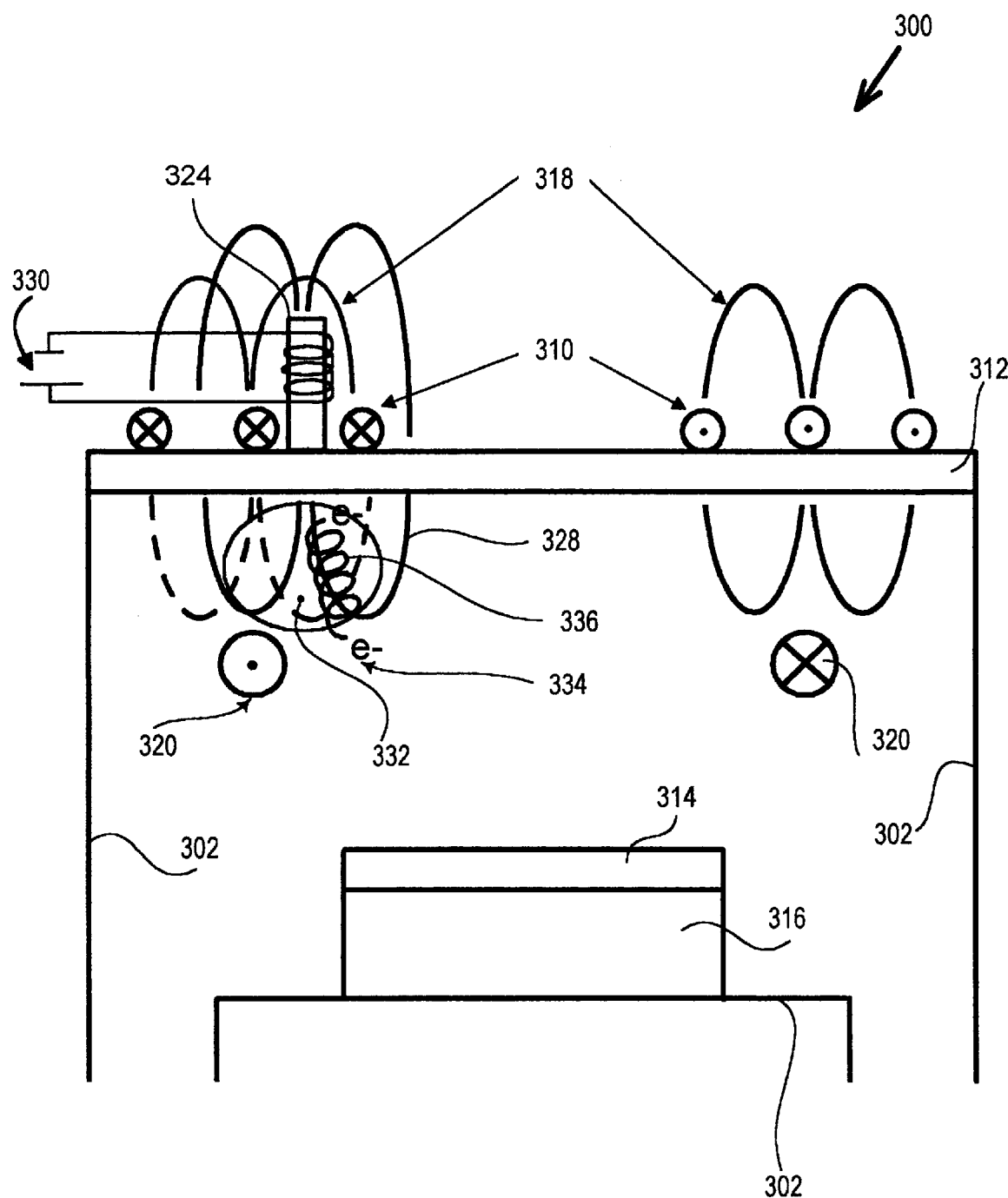
FIG. 2a is a schematic diagram of a prior art inductive plasma processing reactor with the inventive addition of a solenoid that produces a DC magnetic field inside the process chamber.

To facilitate discussion of the features and advantages of the present invention, FIG. 2a depicts an inductive plasma processing reactor with the inventive addition of a magnetic field producing apparatus, such as solenoid. An inductive plasma processing reactor 300 consists of a chamber 302 with an antenna or inductive coil 310 disposed above a dielectric window 312. A substrate 314 is disposed above a chuck 316. The chuck 316 is disposed at the bottom of the chamber 302. When RF power is supplied to the inductive coil 310, an oscillating magnetic field 318 is created. This oscillating magnetic field 318 induces an electric current 320 inside the chamber 302 and below the dielectric window 312. In a manner analogous to the discussion associated with FIGS. 1 *a* & *b*, the electric current 320 runs in the opposite direction of the current in the inductive coil. The direction of the current is portrayed by the x and dot inside the inductive coil 310 and the electric current 320.

When RF power is supplied to the inductive coil 310 a voltage drop occurs across the dielectric window 312 and the vacuum chamber volume to electrically grounded surfaces. This voltage initiates the plasma breakdown. Generally, the free electrons are accelerated to a high energy by the circulating electric current 320. The electrons are accelerated in alternating directions (dependent on RF of the power source). The accelerated electrons collide with other neutral molecules creating more electrons and positively charged ions. As soon as the creation rate of free electrons exceeds their loss rate, the plasma ignites.

A solenoid 324 is disposed outside the chamber 302. The solenoid 324 is preferably near a high voltage point on the inductive coil 310. The solenoid induces a DC magnetic field 328 with a DC power source 330. In one embodiment, the DC power source 330 provide a DC voltage that produces a magnetic field suitable for promoting plasma ignition, e.g., approximately 200 volts DC power. The DC magnetic field 328 exists inside the chamber 302 in a region 332, as shown, to trap temporarily electrons 334 and cause them to spiral along the magnetic field lines 336 of the DC magnetic field 328. Because the electrons 334 spend more time in the region 332, they are more likely to collide with neutral molecules prior to being recombined onto the chamber walls. This greatly increases the likelihood of plasma ignition at low pressures and/or low inductive source power.

Typically, the accelerated electrons collide with neutral molecules creating more electrons and positively charged ions, initiating a discharge. The DC magnetic field 328 in the region 332 is no longer needed at that point. Plasma breakdown occurs and the plasma ignites.

As can be appreciated by one skilled in the art, there are many different types of configurations for an inductive plasma processing reactor and plasma ignition may be facilitated by providing a magnetic field producing apparatus proximate to the location where free electrons are initially produced. By way of example, FIG. 2b is another illustration of the inductive plasma processing reactor as shown in FIG. 1b with the inventive addition of a magnetic field producing apparatus, such as a solenoid.

Figure 2B:
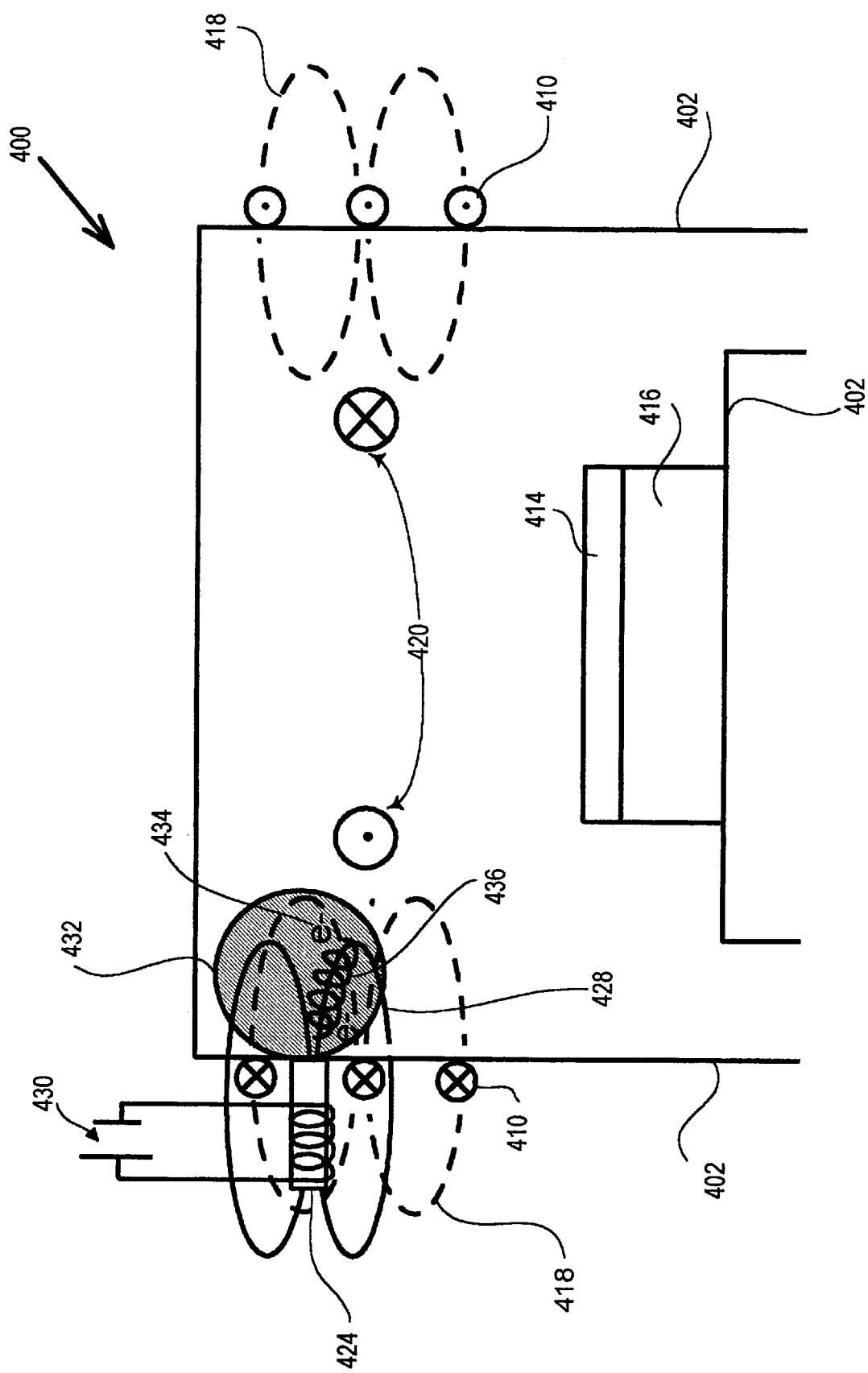
FIG. 2b is a schematic diagram of a prior art inductive plasma processing reactor with an alternative inductive configuration and the inventive addition of a solenoid that produces a DC magnetic field inside the process chamber.

In FIG. 2b, a solenoid 424 is disposed outside the chamber 402. The solenoid 424 is preferably located at a high voltage point of the inductive coil 410. Of course this high voltage point varies with different designs of the inductive coil and may be readily determined by one skilled in the art, either experimentally or by calculation. The solenoid induces a DC magnetic field 428 with a DC power source 430. In this embodiment, the DC power source 430 operates at a voltage suitable to produce a magnetic field that promotes plasma ignition, e.g., approximately 200 volts. The DC magnetic field 428 exists inside the chamber 402 in a region 432. The DC magnetic field 428 temporarily traps electrons 434, causing them to spiral around the path 436 to increase the residence time of the electrons to promote the start of the cascade that causes plasma ignition.

In the preferred embodiment, the magnetic field inside the chamber is induced by a solenoid. The solenoid is preferably powered by approximately 200 volts DC and produces a magnetic flux between about 25 to 500 gauss. However, it is preferred that the magnetic flux be kept as low as possible while still maintaining a high enough flux to ignite the plasma. Also, note that the exact voltage level of the DC voltage may vary as needed to a level effective to produce a magnetic flux strong enough to ignite the plasma. A low powered flux is preferable because it offers the least amount of disturbance to the process. In addition, this invention is not limited to a magnetic field produced by a solenoid, any means that can generate a magnetic field effective to ignite the plasma in a given plasma processing reactor can be employed (e.g., permanent magnets that can be physically moved upon plasma ignition).

As mentioned, the location of the DC magnetic field is preferably proximate the region in the plasma processing chamber where the electrons are initially accelerated by the high voltage from the induction coil. More preferably, the magnetic field producing apparatus (such as the solenoid) is positioned such that the magnetic field is proximate the electric field produced by the inductive coil. This is because most of the electrons initially generated tend to be concentrated in the electric field region. Even more preferably, the magnetic field producing apparatus is positioned at a location that allows the magnetic field produced thereby to coincide with the region within the plasma processing chamber where the electric field line concentration is the highest.

By way of example, the magnetic field producing apparatus may be placed in between adjacent coils of the inductive coil such that a sufficiently high number of electrons are exposed to the magnetic field when the magnetic field producing apparatus is powered. However, it is also possible to position the magnetic field producing apparatus at other locations, such at atop the coils, or at some location proximate to the coils.

Figure 3:
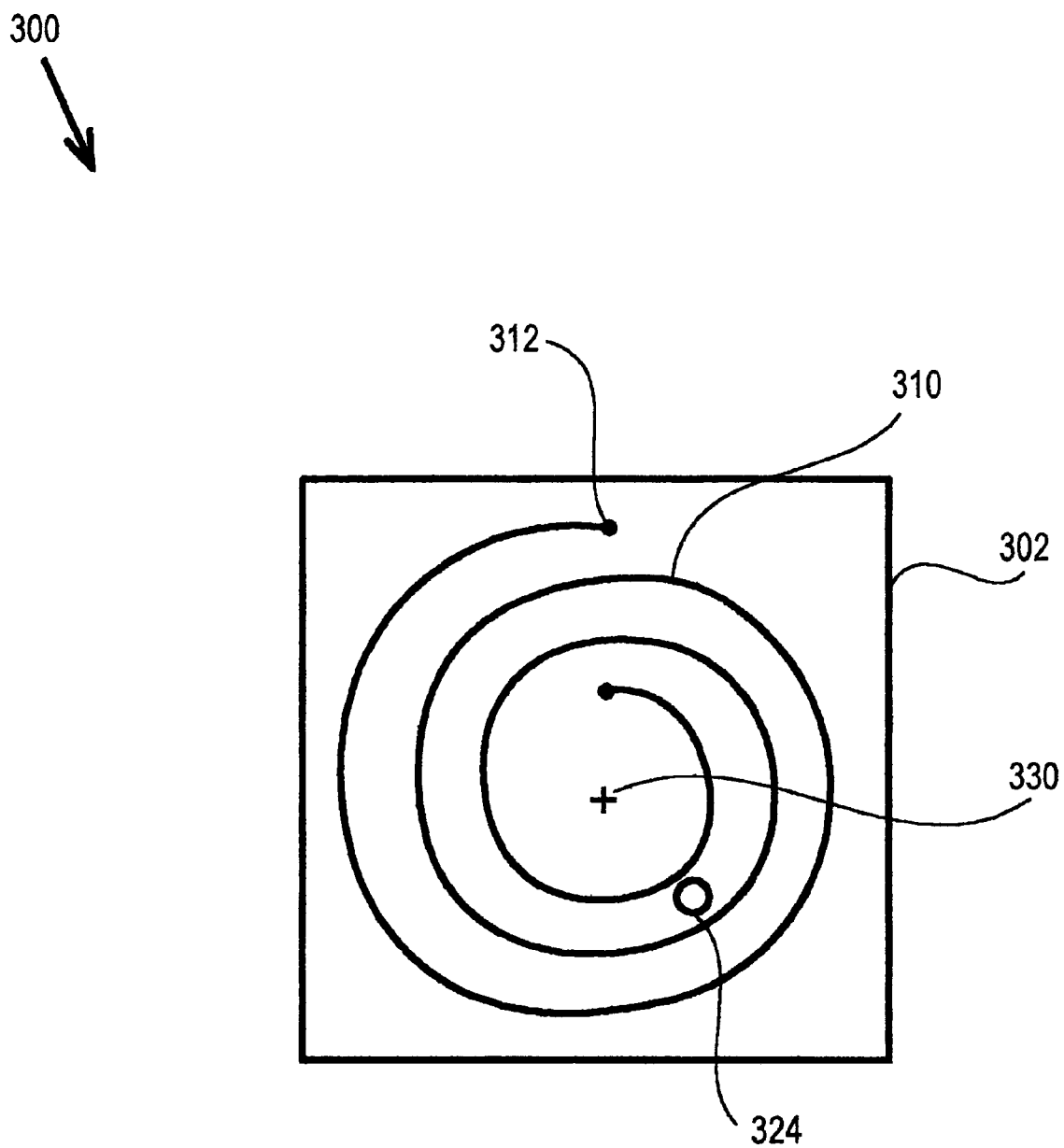
FIG. 3 shows a top view of the inductive plasma processing reactor of FIG. 2a, including the solenoid disposed at a preferred position.

FIG. 3 is a top view illustration, in accordance with one embodiment of the present invention, of the approximate location of a solenoid 324 relative to inductive coil 310 of the plasma processing reactor discussed earlier in connection with FIG. 2a. Note that inductive coil 310 does not have to be planar, and may assume other nonplanar shapes. For the plasma processing chamber of FIG. 2b, the magnetic field producing apparatus may be similarly positioned relative to the inductive coil so as to promote plasma ignition (e.g., in between adjacent coils or a top of the coils).

As mentioned, the magnetic field produced by the magnetic field producing apparatus is preferably off after plasma ignition occurs in order to minimize the impact of the magnetic field on the process. In general, the detection of plasma ignition for the purpose of turning off the magnetic field producing apparatus may be performed using any conventional method, including, for example, optical emission detection, sensing of the reflective power in the match networks, or the like.

Note that although the preferred embodiment contemplates that the magnetic field produced be sufficiently strong to promote plasma ignition without having to raise either the pressure within the chamber or the power to the top electrode, it is possible to employ the inventive ignition technique to reduce, instead of eliminate, the need to raise the pressure within the chamber and/or the power to the top electrode. By way of example, the presence of the magnetic field may raise the residence time of the electrons and the probability of collision such that only a slight increase in the chamber pressure and/or a slight increase in the top power level is required.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing reactor for processing a substrate, comprising:

a process chamber within which a plasma can be both ignited and sustained for said processing;

a RF power source having a RF frequency;

an inductive coil coupled to said RF power source and configured to generate an electric field inside of said process chamber; and a magnetic field producing apparatus configured to produce a magnetic field inside said process chamber in proximity of said electric field, said magnetic field being effective to promote ignition of said plasma within said process chamber, said magnetic field being activated to ignite said plasma and then deactivated after said plasma is ignited within said process chamber.

2. The plasma processing reactor of claim 1 wherein said RF frequency is about 13.5 MHz.

3. The plasma processing reactor of claim 1 wherein said magnetic field producing apparatus is a solenoid; said solenoid being powered by about 200 volt DC power.

4. The plasma processing reactor of claim 1 wherein said magnetic field has a magnetic flux in the range of about 25 to about 500 Gauss.

5. The plasma processing reactor of claim 1 wherein said magnetic field producing apparatus activates said magnetic field only for a period of time sufficient to ignite a plasma in said process chamber.

6. The plasma processing reactor of claim 1 wherein said magnetic field producing apparatus is placed between adjacent rings of said inductive coil.

7. The plasma processing reactor of claim 1 wherein said RF power source is set at a level suitable for said processing when said magnetic field producing apparatus is activated.

8. The plasma processing reactor of claim 1 wherein a chamber pressure within said plasma processing reactor is set at a level suitable for said processing when said magnetic field producing apparatus is activated.

9. The plasma processing reactor of claim 1 wherein said magnetic field is not activated during processing of said substrate.

10. The plasma processing reactor of claim 1 wherein said magnetic field producing apparatus is arranged to concentrate said magnetic field in a predetermined region of said electric field.

11. The plasma processing reactor of claim 10 wherein said predetermined region is where the electrons of said electric field are initially accelerated by said inductive coil.

12. The plasma processing reactor of claim 10 wherein said predetermined region is at a location inside said process chamber where the electric field line concentration of said electric field is the highest.

13. The plasma processing reactor of claim 1 wherein said magnetic field producing apparatus is disposed proximate a high voltage point of said inductive electrode.

14. The plasma processing reactor of claim 1 wherein said magnetic field is not symmetrically disposed within said process chamber.

15. A plasma processing reactor for processing substrates inside a process chamber, comprising:
   means for generating an electric field inside said process chamber of said plasma processing reactor;
   means, disposed externally of said process chamber, for generating a magnetic field in proximity of said electric field inside said process chamber, said magnetic field being effective to promote the ignition of a plasma within said process chamber; and
   activation means, coupled to said means for generating said magnetic field, for controlling an activation of said magnetic field, said magnetic field being activated to ignite said plasma and then deactivated after said plasma is ignited within said process chamber.

16. The plasma processing reactor of claim 15 wherein said means for generating said electric field is an inductive coil coupled to an RF power source.

17. The plasma processing reactor of claim 15 wherein said means for generating said magnetic field is a solenoid coupled to a DC power source.

18. The plasma processing reactor of claim 15 wherein said magnetic field has a magnetic flux in the range of about 25 to about 500 Gauss during ignition of a plasma inside said process chamber.

19. The plasma processing reactor of claim 15 wherein said activation means activates said magnetic field only for a period of time sufficient to ignite a plasma inside said process chamber.

20. The plasma processing reactor of claim 15 wherein said means for generating said magnetic field is placed in proximity of said means for generating said electric field.

21. The plasma processing reactor of claim 15 wherein said means for generating said electric field is set at a level suitable for said processing when said magnetic field is present to promote ignition of a plasma within said process chamber.

22. The plasma processing reactor of claim 15 wherein a chamber pressure inside said process chamber is set at a level suitable for said processing when said magnetic field is present to promote ignition of a plasma within said process chamber.

23. In a plasma processing reactor, a method of igniting a plasma inside a process chamber, comprising:
   providing an inductive coil;
   coupling an RF power source to said inductive coil to provide RF power to said inductive coil, thereby generating an electric field inside said process chamber;
   providing a magnetic field producing apparatus disposed outside of said process chamber, said magnetic field producing apparatus being configured to produced a magnetic field inside said process chamber in proximity of said electric field;
   generating said magnetic field with said magnetic field producing apparatus to promote ignition of a plasma within said process chamber; and
   removing said magnetic field from said process chamber when said plasma is ignited within said process chamber.

24. The method of claim 23 wherein said RF power has an RF frequency of about 13.5 MHz.

25. The method of claim 23 wherein said magnetic field producing apparatus is a solenoid coupled to a DC power source.

26. The method of claim 23 wherein said magnetic field has a magnetic flux in the range of about 25 to about 500 Gauss.

27. The method of claim 23 wherein said generating is only for a period of time sufficient to ignite said plasma in said process chamber.

28. The method of claim 23 wherein said magnetic field producing apparatus is placed between adjacent rings of said inductive coil.

29. The method of claim 23 wherein said RF power source is set at a level suitable for said processing when said magnetic field is generated within said process chamber to promote ignition of said plasma within said process chamber.

30. The method of claim 23 wherein a chamber pressure within said plasma processing reactor is set at a level suitable for said processing when said magnetic field is generated within said process chamber to promote ignition of said plasma within said process chamber.

* * * * *